US008955456B2

(12) United States Patent
Cullen et al.

(10) Patent No.: US 8,955,456 B2
(45) Date of Patent: Feb. 17, 2015

(54) MICROWAVE PLASMA REACTOR FOR MANUFACTURING SYNTHETIC DIAMOND MATERIAL (75) Inventors: Alexander Lamb Cullen, Ascot (GB); Joseph Michael Dodson, Ascot (GB); Stephen David Williams, Ascot (GB); John Robert Brandon, Ascot (GB)

(73) Assignee: Element Six Limited, Ballasalla (IM)

( * ) Notice: Subject to any disclaimer, the term of this patent is extended or adjusted under 35 U.S.C. 154(b) by 37 days.

(21) Appl. No.: 13/994,836

(22) PCT Filed: Dec. 14, 2011
(Under 37 CFR 1.47)

(86) PCT No.: PCT/EP2011/072823
§ 371 (c)(1),
(2), (4) Date: Feb. 7, 2014

(87) PCT Pub. No.: WO2012/084659
PCT Pub. Date: Jun. 28, 2012

(65) Prior Publication Data
US 2014/0308461 A1 Oct. 16, 2014

Related U.S. Application Data (60) Provisional application No. 61/439,305, filed on Feb. 3, 2011.

(30) Foreign Application Priority Data

Dec. 23, 2010 (GB) .................................. 1021860.0

(51) Int. Cl.
H01J 37/00 (2006.01)
H01J 37/32 (2006.01)
(Continued)

(52) U.S. Cl.
CPC ......... H01J 37/32238 (2013.01); C23C 16/274 (2013.01); C23C 16/511 (2013.01);
(Continued)

(58) Field of Classification Search
CPC C23C 16/274; C23C 16/511; C23C 14/0611; H01J 37/32009; H01J 37/32192; H01J 37/32211; H01J 37/32266
USPC .................................................. 118/723 MW
See application file for complete search history.

(56) References Cited

U.S. PATENT DOCUMENTS
4,869,923 A 9/1989 Yamazaki
(Continued)

FOREIGN PATENT DOCUMENTS
CN 101385129 3/2009
(Continued)

OTHER PUBLICATIONS
Balmer et al., Chemical vapour deposition synthetic diamond: materials, technology and applications, J. Phys: Condensed Matter, 2009, 364221, 21(36).
(Continued)

Primary Examiner — Dah-Wei D Yuan
Assistant Examiner — Jose Hernandez-Diaz
(74) Attorney, Agent, or Firm — Bryan Cave LLP (57) ABSTRACT A microwave plasma reactor for manufacturing a synthetic diamond material via chemical vapour deposition, the microwave plasma reactor comprising: a plasma chamber (2); a substrate holder (4) disposed in the plasma chamber for supporting a substrate on which the synthetic diamond material is to be deposited in use; a microwave coupling configuration (12) for feeding microwaves from a microwave generator (8) into the plasma chamber; and a gas flow system (13,16) for feeding process gases into the plasma chamber and removing them therefrom, wherein the microwave coupling configuration for feeding microwaves from the microwave generator into the plasma chamber comprises: an annular dielectric window (18) formed in one or several sections; a coaxial waveguide (14) having a central inner conductor (20) and an outer conductor (22) for feeding microwaves to the annular dielectric window; and a waveguide plate (24) comprising a plurality of apertures (28) disposed in an annular configuration with a plurality of arms (26) extending between the apertures, each aperture forming a waveguide for coupling microwaves towards the plasma chamber.

13 Claims, 3 Drawing Sheets (51) Int. Cl.
  *C23C 16/27* (2006.01)
  *C23C 16/511* (2006.01)
  *C23C 16/00* (2006.01)
(52) U.S. Cl.
  CPC ..... *H01J 37/32009* (2013.01); *H01J 37/32192* (2013.01); *H01J 37/32211* (2013.01); *H01J 37/32229* (2013.01); *H01J 37/32266* (2013.01); *H01J 37/3244* (2013.01); *H01J 2237/3321* (2013.01)
  USPC ................................. 118/723 MW; 427/575

(56) References Cited

U.S. PATENT DOCUMENTS

| | | | |
|---|---|---|---|
| 4,989,542 A | 2/1991 | Kamo | |
| 5,091,208 A | 2/1992 | Pryor | |
| 5,258,206 A | 11/1993 | Hayashi et al. | |
| 5,261,959 A | 11/1993 | Gasworth | |
| 5,273,731 A | 12/1993 | Anthony et al. | |
| 5,273,790 A | 12/1993 | Herb et al. | |
| 5,302,226 A | 4/1994 | Yamazaki et al. | |
| 5,302,803 A | 4/1994 | Stevens et al. | |
| 5,311,103 A | 5/1994 | Asmussen et al. | |
| 5,397,396 A | 3/1995 | Kosky et al. | |
| 5,501,740 A | 3/1996 | Besen et al. | |
| 5,643,365 A | 7/1997 | Blinov et al. | |
| 5,683,759 A | 11/1997 | Shepard, Jr. et al. | |
| 5,981,057 A | 11/1999 | Collins | |
| 6,091,045 A | 7/2000 | Mabuchi et al. | |
| 6,106,678 A | 8/2000 | Shufflebotham et al. | |
| 6,158,383 A * | 12/2000 | Watanabe et al. ...... | 118/723 AN |
| 6,254,683 B1 | 7/2001 | Matsuda et al. | |
| 6,319,439 B1 | 11/2001 | Lee et al. | |
| 6,325,018 B1 * | 12/2001 | Hongoh ................. | 118/723 AN |
| 6,388,632 B1 | 5/2002 | Murakawa et al. | |
| 6,414,338 B1 | 7/2002 | Anderson | |
| 6,427,621 B1 | 8/2002 | Ikegawa et al. | |
| 6,433,298 B1 | 8/2002 | Ishii | |
| 6,487,986 B1 | 12/2002 | Liehr et al. | |
| 6,565,661 B1 | 5/2003 | Nguyen | |
| 6,645,343 B1 | 11/2003 | Wild et al. | |
| 7,581,511 B2 * | 9/2009 | Mardian et al. ........ | 118/723 MW |
| 2001/0023663 A1 | 9/2001 | Kazumi et al. | |
| 2001/0036465 A1 | 11/2001 | Ishll et al. | |
| 2003/0107003 A1 | 6/2003 | Whitehead | |
| 2003/0150561 A1 | 8/2003 | Ishii et al. | |
| 2003/0150846 A1 | 8/2003 | Ishii et al. | |
| 2003/0200914 A1 | 10/2003 | Noguchi et al. | |
| 2004/0045674 A1 | 3/2004 | Ishii et al. | |
| 2005/0005853 A1 | 1/2005 | Behle et al. | |
| 2005/0109267 A1 | 5/2005 | Linares et al. | |
| 2005/0266606 A1 | 12/2005 | Chevallier et al. | |
| 2006/0266279 A1 | 11/2006 | Mokuno | |
| 2007/0163996 A1 | 7/2007 | Horiguchi | |
| 2007/0221294 A1 | 9/2007 | Sasaki | |
| 2008/0099768 A1 | 5/2008 | Scarsbrook et al. | |
| 2008/0156256 A1 | 7/2008 | Linares et al. | |
| 2008/0190356 A1 | 8/2008 | Bhandari | |
| 2008/0303744 A1 | 12/2008 | Hirayama et al. | |
| 2010/0028556 A1 | 2/2010 | Linares et al. | |
| 2010/0034984 A1 | 2/2010 | Asmussen et al. | |
| 2010/0178234 A1 | 7/2010 | Noguchi | |
| 2010/0189924 A1 | 7/2010 | D'Evelyn et al. | |
| 2011/0114261 A1 | 5/2011 | Matsumoto et al. | |

FOREIGN PATENT DOCUMENTS

| | | |
|---|---|---|
| EP | 0343602 A3 | 11/1989 |
| EP | 0390209 A3 | 10/1990 |
| EP | 0447031 A1 | 9/1991 |
| EP | 0480581 | 9/1991 |
| EP | 0467043 A2 | 1/1992 |
| EP | 0487292 A1 | 5/1992 |
| EP | 0526657 A1 | 2/1993 |
| EP | 0546752 A1 | 6/1993 |
| EP | 0582397 A2 | 2/1994 |
| EP | 0597445 A2 | 5/1994 |
| EP | 0695816 A1 | 2/1996 |
| EP | 0727507 A2 | 8/1996 |
| EP | 0758688 A1 | 2/1997 |
| EP | 0822269 | 4/1998 |
| EP | 1500718 A1 | 1/2005 |
| EP | 1643641 A2 | 4/2006 |
| EP | 1463849 | 1/2007 |
| EP | 2108714 A1 | 10/2009 |
| FR | 2798552 | 3/2001 |
| JP | S62162366 A | 7/1987 |
| JP | S62167886 A | 7/1987 |
| JP | S62235393 A | 10/1987 |
| JP | 03281594 C2 | 12/1991 |
| JP | 4009471 A | 1/1992 |
| JP | 4-228495 A | 8/1992 |
| JP | H04238896 | 8/1992 |
| JP | H05013342 A | 1/1993 |
| JP | H061251158 A | 9/1994 |
| JP | H08133893 A | 5/1996 |
| JP | 2001007385 | 1/2001 |
| JP | 2002265296 A | 3/2001 |
| JP | 2003-045810 A | 2/2003 |
| JP | 2003045810 A | 2/2003 |
| JP | 2003-142471 A | 5/2003 |
| JP | 2004-235434 A | 8/2004 |
| JP | 2004235434 A | 8/2004 |
| JP | 2004244298 A | 9/2004 |
| JP | 2005-044822 A | 2/2005 |
| JP | 2007142195 | 6/2007 |
| JP | 2007273913 A | 10/2007 |
| JP | 2007284773 A | 11/2007 |
| JP | 2007331955 A | 12/2007 |
| JP | 2006286269 A | 5/2008 |
| JP | 2009280421 A | 12/2009 |
| KR | 20020061768 A | 7/2002 |
| SE | 500740 C2 | 8/1994 |
| WO | 02/077319 A1 | 10/2002 |
| WO | 03/040440 A2 | 5/2003 |
| WO | 2006/117621 | 11/2006 |
| WO | 2006/127611 A2 | 11/2006 |
| WO | 2007/092893 A2 | 8/2007 |
| WO | 2008/025899 | 3/2008 |
| WO | 2008/029258 | 3/2008 |
| WO | 2008/090510 | 7/2008 |
| WO | 2008-123605 A1 | 10/2008 |
| WO | 2008/123605 A1 | 10/2008 |
| WO | 2010-004836 A1 | 1/2010 |
| WO | 2010/004836 A1 | 1/2010 |
| WO | 2010-021382 A1 | 2/2010 |
| WO | 2010/021382 A1 | 2/2010 |
| WO | 2010/084655 | 7/2010 |

OTHER PUBLICATIONS

International Search Report issued on PCT/EP2011/072823, dated Jul. 4, 2012.
Search Report issued on GB1021860.0, dated Apr. 20, 2011.
Search Report issued on GB1121492.1, dated Apr. 12, 2012.
Balmer et al., Chemical vapour deposition synthetic diamond: materials, technology and applications, Journal of Physics: Condensed Matter, 21, 2009.
Whitfield et al., Nucleation and growth of diamond films on single crystal and polycrystalline tungsten substrates, Diamond and Related Materials, vol. 9, pp. 262-268, 2000.
International Search Report issued on PCT/EP2011/072824, dated May 3, 2012.
Silva et al., Microwave Analysis of PACVD diamond deposition reactor based on electromagnetic materials, Diamond & Related Materials, vol. 19, pp. 397-403, 2010.
Search Report issued on GB1121517.5, dated Mar. 27, 2012.
Funer et al., Simulation and development of optimized microwave plasma reactors for diamond deposition, Surface and Coatings Technology, 1999, 853-862, vol. 116-119.
Hassouni et al., Self-consistent microwave field and plasma discharge simulations for a moderate pressure hydrogen discharge reactor, Journal of Applied Physics, 1999, pp. 134-151, 86(1).

(56) References Cited

OTHER PUBLICATIONS

Search Report issued on GB1021913.7, dated Apr. 21, 2011.
Kosky et al., Fracture-free release of CVD diamond, Diamond and Related Materials 5 (1996) pp. 1313-1317.
Asmussen, et al., Multiple substrate microwave plasma-assisted chemical vapor deposition single crystal diamond syntheses, Applied Physics Letters, p. 93, 031502, 2008.
Chae, et al., The 8-inch free-standing CVD diamond wafer fabricated by DC-PACVD, Diamond and Related Materials, 19, 2010, pp. 1168-1171.
Gray, et al., Free-standing CVD diamond wafers for thermal management by d.c. arc jet technology, Diamond and Related Materials 8, 1999, 903-908.
Liao, Samuel Y., Microwave Devices and Circuits, 3d Edition, published by Prentice-Hall, Inc., New Jersey pp. 144-156.
Hassouni et la., Modelling of diamond deposition microwave cavity generated plasmas, J. Phys. D. Appl. Phys,. 43 (2010) 153001.
Hemawan, et a., Improved microwave plasma cavity reactor for diamond synthesis at high-pressure and high power density, Diamond & Related Materials 19 (2010) 1446-1452.
Alam et al., Adhesion of diamond coatings on tungsten substrates, Journal of Adhesion Science and Technology, vol. 9, No. 6, 1995 Netherlands, 653-679.
Feng, et al., Surface stress measurement with interference microscopy of thick homoepitaxial single-crystal diamond layers, Diamond & Related Materials 19 (2010) 1453-1456.
Yamada, Simulation with an improved plasma model utilized to design a new structure of microwave plasma dischage for chemical vapor deposition of diamond crystals, Diamond and Related Materials, 17, Issues 4-5 (2008), pp. 494-497.
Achard, J., et al., Thick boron doped diamond single crystals for high power electronics, Diamond & Related Materials, 20, pp. 145-152, 2010.
Lee, et al., Single-cathode DC PACVD process for large-area CVD diamond wafer fabrication, 203rd Meeting of the Electrochemical Society, Eighth International Symposium on Diamond Materials, 2003.
Funer et al., Numerical simulations of microwave plasma reactor for diamond CVD, Surface and Coatings Technology, 74-75 (1995), pp. 221-226.
International Search Report issued on PCT/EP2011/072820, dated Mar. 30, 2012.
Search Report issued on GB1121474.9, dated Mar. 27, 2012.
Search Report issued on GB1305030.7 dated Apr. 16, 2013.
Search Report issued on GB1305041.4 dated Apr. 15, 2013.
Search Report issued on GB1305045.5 dated Apr. 16, 2013.
Search Report issued on GB1121486.3 dated Apr. 12, 2012.
Search Report issued on GB1021870.9 dated Apr. 6, 2011.
Search Report issued on GB1021865.9 dated Apr. 20, 2011.
Search Report issued on GB1121494.7 dated Apr. 7, 2012.
Search Report issued on GB1021860.0 dated Apr. 20, 2011.
Search Report issued on GB1121492.1 dated Apr. 12, 2012.
Search Report issued on GB1021855.0 dated May 31, 2011.
Search Report issued on GB1121499.6 dated Jan. 27, 2012.
Search Report issued on GB1121505.0 dated Mar. 29, 2012.
International Search Report issued on PCT/EP2011/072825 dated Mar. 30, 2012.
Search Report issued on GB1021853.5 dated Mar. 30, 2011.
International Search Report issued on PCT/EP2011/072822, dated May 23, 2012.
International Search Report issued on PCT/EP2011/072818, dated Jun. 22, 2012.
International Search Report issued on PCT/EP2011/072821, dated Mar. 2, 2012.
Silva, F., et al., Microwave engineering of plasma-assisted CVD reactors for diamond deposition, Journal of Physics; Condensed Matter, vol. 21, No. 364202, 2009.

\* cited by examiner

MICROWAVE PLASMA REACTOR FOR MANUFACTURING SYNTHETIC DIAMOND MATERIAL

FIELD OF INVENTION

The present invention relates to a microwave plasma reactor for manufacturing synthetic diamond material using chemical vapour deposition techniques.

BACKGROUND OF INVENTION

Chemical vapour deposition (CVD) processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. In the presence of a suitable substrate material, diamond can be deposited.

Atomic hydrogen is essential to the process because it selectively etches off non-diamond carbon from the substrate such that diamond growth can occur. Various methods are available for heating carbon containing gas species and molecular hydrogen in order to generate the reactive carbon containing radicals and atomic hydrogen required for CVD diamond growth including arc-jet, hot filament, DC arc, oxy-acetylene flame, and microwave plasma.

Methods that involve electrodes, such as DC arc plasmas, can have disadvantages due to electrode erosion and incorporation of material into the diamond. Combustion methods avoid the electrode erosion problem but are reliant on relatively expensive feed gases that must be purified to levels consistent with high quality diamond growth. Also the temperature of the flame, even when combusting oxy-acetylene mixes, is insufficient to achieve a substantial fraction of atomic hydrogen in the gas stream and the methods rely on concentrating the flux of gas in a localized area to achieve reasonable growth rates. Perhaps the principal reason why combustion is not widely used for bulk diamond growth is the cost in terms of kWh of energy that can be extracted. Compared to electricity, high purity acetylene and oxygen are an expensive way to generate heat. Hot filament reactors while appearing superficially simple have the disadvantages of limited dissociation to form active species and restriction to use at lower gas pressures which are required to ensure relatively effective transport of their limited quantities of atomic hydrogen to a growth surface.

In light of the above, it has been found that microwave plasma is the most effective method for driving CVD diamond deposition in terms of the combination of power efficiency, growth rate, growth area, and purity of product which is obtainable.

A microwave plasma activated CVD diamond synthesis system typically comprises a plasma reactor vessel coupled both to a supply of source gases and to a microwave power source. The plasma reactor vessel is configured to form a resonance cavity supporting a standing microwave. Source gases including a carbon source and molecular hydrogen are fed into the plasma reactor vessel and can be activated by the standing microwave to form a plasma in high field regions. If a suitable substrate is provided in close proximity to the plasma, reactive carbon containing radicals can diffuse from the plasma to the substrate and be deposited thereon. Atomic hydrogen can also diffuse from the plasma to the substrate and selectively etch off non-diamond carbon from the substrate such that diamond growth can occur.

A range of possible microwave plasma reactors for diamond film growth via a chemical vapour deposition (CVD) process are known in the art. Such reactors have a variety of different designs. Common features include: a plasma chamber; a substrate holder disposed in the plasma chamber; a microwave generator for forming the plasma; a coupling configuration for feeding microwaves from the microwave generator into the plasma chamber; a gas flow system for feeding process gases into the plasma chamber and removing them therefrom; and a temperature control system for controlling the temperature of a substrate on the substrate holder.

U.S. Pat. No. 6,645,343 (Fraunhofer) discloses an example of a microwave plasma reactor configured for diamond film growth via a chemical vapour deposition process. The reactor described therein comprises a cylindrical plasma chamber with a substrate holder mounted on a base thereof. A gas inlet and a gas outlet are provided in the base of the plasma chamber for supplying and removing process gases. A microwave generator is coupled to the plasma chamber via a high-frequency coaxial line which is subdivided at its delivery end above the plasma chamber and directed around an upper peripheral region of the plasma chamber to an essentially ring-shaped microwave window in the form of a quartz ring. The invention as described in U.S. Pat. No. 6,645,343 focuses on the ring-shaped microwave window and discloses that the coupling of microwaves in the reactor chamber is distributed in a circularly symmetric fashion over the entire ring surface of the microwave window. It is taught that because the coupling is distributed over a large surface, high microwave power levels can be coupled without high electric field intensities developing at the microwave window thus reducing the danger of window discharge.

The present inventors have identified several potential problems with the coupling configuration described in U.S. Pat. No. 6,645,343 for feeding microwaves from the microwave generator into the plasma chamber:

(i) The upper housing section may be prone to over-heating in use due to high temperature plasma formed in the reactor chamber. The arrangement described in U.S. Pat. No. 6,645,343 doesn't address the issue of extracting waste energy from the upper housing section. In time this wall may become very hot leading to eventual failure of the annular window seal and of the annular window itself. The funnel shaped coaxial line entirely surrounds the upper portion of the chamber and so it is difficult to envisage how any coolant could be supplied to the upper portion of the chamber in the described arrangement.

(ii) U.S. Pat. No. 6,645,343 mentions the possibility that the connection for supplying process gas can face the substrate holder and can be directed approximately centrally towards the substrate holder. However, U.S. Pat. No. 6,645,343 does not describe any means of achieving this arrangement. As described above, the funnel shaped coaxial line entirely surrounds the upper portion of the chamber and so it is difficult to envisage how any process gases could be supplied centrally to an upper portion of the chamber and directed towards the substrate holder. The only possibility would appear to involve feeding process gases down through the central inner conductor of the coaxial feed. In the arrangement described in U.S. Pat. No. 6,645,343, the inner central conductor of the coaxial feed extends from an upper wall of the rectangular waveguide from the microwave generator to the funnel-shaped transition area. If services such as process gases and/or coolant are to be provided to the upper housing of the plasma chamber, they must be contained in a relatively restricted passage within the inner central conductor over a considerable distance.

(iii) In the arrangement described in U.S. Pat. No. 6,645,343, the inner central conductor of the coaxial feed extends from an upper wall of the rectangular waveguide from the microwave generator thus providing an electrically grounded point. Accordingly, the waveguide transition must be designed to operate with a grounded inner conductor. One of the potential disadvantages of this design is the requirement to make the distance between the grounded inner conductor and the short circuit of the rectangular waveguide to be a half guided wavelength. If not precisely configured, this can adversely affect power coupling into the chamber. Having the inner conductor of the coaxial waveguide electrically floating in the waveguide is in many respects a simpler and more convenient method of transferring power from a rectangular to a coaxial waveguide but has the disadvantage of losing the grounded point at which services such as water and gas can be introduced.

(iv) In U.S. Pat. No. 6,645,343, the ring-shaped microwave window forms a portion of the side wall of the reactor chamber between upper and lower housing sections. As such, the ring-shaped microwave window may be placed in compression by the overlying upper housing section which may cause damage to the microwave window. Furthermore, it may be difficult to easily and reliably form a vacuum seal between the upper and lower housing sections at the ring-shaped microwave window. In order to solve this problem it may be possible to modify the arrangement described in U.S. Pat. No. 6,645,343 such that the grounded inner conductor has the added function of providing a mechanical anchor point through which tension can be applied to resist the opposing pressure caused by the reduced pressure inside the cavity compared to that outside. To help achieve an effective seal it is possible to use a tensioning spring arrangement that maintains a consistent force on the annular window and its seals. However, this arrangement adds complexity. Furthermore, if it is desired to use a floating inner conductor no mechanical link is possible and an alternative must be sought.

(v) In U.S. Pat. No. 6,645,343, a complicated funnel-shaped coaxial line is described for guiding the microwaves to the ring-shaped microwave window forming a portion of the side wall of the plasma chamber. Such a complicated waveguide structure having multiple transitions is not considered to be desirable for optimum power handling and efficient coupling of microwaves into the plasma chamber.

It is an aim of certain embodiments of the present invention to address one or more of these problems.

SUMMARY OF INVENTION

According to certain embodiments of the present invention there is provided a microwave plasma reactor for manufacturing a synthetic diamond material via chemical vapour deposition, the microwave plasma reactor comprising:
- a plasma chamber;
- a substrate holder disposed in the plasma chamber for supporting a substrate on which the synthetic diamond material is to be deposited in use;
- a microwave coupling configuration for feeding microwaves from a microwave generator into the plasma chamber; and
- a gas flow system for feeding process gases into the plasma chamber and removing them therefrom, wherein the microwave coupling configuration for feeding microwaves from the microwave generator into the plasma chamber comprises:
- an annular dielectric window formed in one or several sections;
- a coaxial waveguide having a central inner conductor and an outer conductor for feeding microwaves to the annular dielectric window; and
- a waveguide plate comprising a plurality of apertures disposed in an annular configuration with a plurality of arms extending between the apertures, each aperture forming a waveguide for coupling microwaves towards the plasma chamber.

According to further embodiments of the present invention there is provided a method of manufacturing synthetic diamond material using a chemical vapour deposition process, the method comprising:
- providing a microwave plasma reactor as described above;
- locating a substrate over the substrate holder;
- feeding microwaves into the plasma chamber;
- feeding process gases into the plasma chamber; and
- forming a layer of synthetic diamond material on the substrate.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION OF CERTAIN EMBODIMENTS

The present inventors concur with the prior art teaching that it can be advantageous to couple microwave power into a plasma chamber for CVD diamond growth via an annular dielectric window. However, as described in the background section, one problem with providing such an arrangement is that the coaxial waveguide structure required to couple microwaves though an annular dielectric window encloses a wall portion of the plasma chamber making it difficult to provide coolant and/or process gas to this wall portion and/or to provide mechanical support to a central inner conductor of the coaxial waveguide.

In order to solve this problem, the present inventors have designed a new microwave coupling configuration for feeding microwaves from the microwave generator into the plasma chamber. The new microwave coupling configuration comprises a waveguide plate comprising a plurality of apertures disposed in an annular configuration, each aperture forming a waveguide for coupling microwaves from the coaxial waveguide towards the plasma chamber. The waveguide plate further comprises a plurality of arms extending between the apertures. The plurality of arms may define one or more channels for supplying coolant and/or process gas. Alternatively, or additionally, the plurality of arms may provide mechanical support for components disposed in an axially central region.

This configuration has been found to be advantageous as it allows microwave power to be coupled into the plasma chamber via an annular dielectric window while also allowing of the provision of coolant and/or process gases to regions of the plasma chamber enclosed by the waveguide structure. As such, the arrangement solves problems (i) and (ii) described in the background section.

In addition to the above, the waveguide plate can be configured to support the central conductor of the coaxial waveguide. Accordingly, the central conductor can be formed as an electrically floating post which is not required to be grounded on an upper wall of the rectangular waveguide from the microwave generator. As described in the background section, it has been found that an inner conductor which is electrically floating in the waveguide is in many respects a simpler and more convenient method of transferring power from a rectangular to a coaxial waveguide. While in prior art arrangements, this has the disadvantage of losing the grounded point at which services such as coolant water and process gas can be introduced, certain embodiments of the present invention provide an alternative and much more convenient route for supplying such services via channels in the waveguide plate. As such, this arrangement solves problem (iii) described in the background section.

Furthermore, the waveguide plate can be configured to couple together upper and lower portions of the plasma chamber and avoid large compressive stresses on the annular dielectric window in use without the use of a mechanical anchor point through a central conductor of the coaxial waveguide. Furthermore, the annular dielectric window may comprise two opposing surfaces through which microwaves are coupled into the plasma chamber and seals may be provided on said two opposing surfaces. This allows for a reliable seal to be formed between upper and lower portions of the plasma chamber and at the dielectric window. As such, this arrangement solves problem (iv) described in the background section.

Finally, the plurality of apertures can be configured to couple microwaves into the plasma chamber in a direction parallel to a central axis of the plasma chamber. This allows for a more simple coaxial waveguide structure when compared with the arrangement described in U.S. Pat. No. 6,645, 343. As such, this arrangement solves problems (v) described in the background section.

Figure 1:
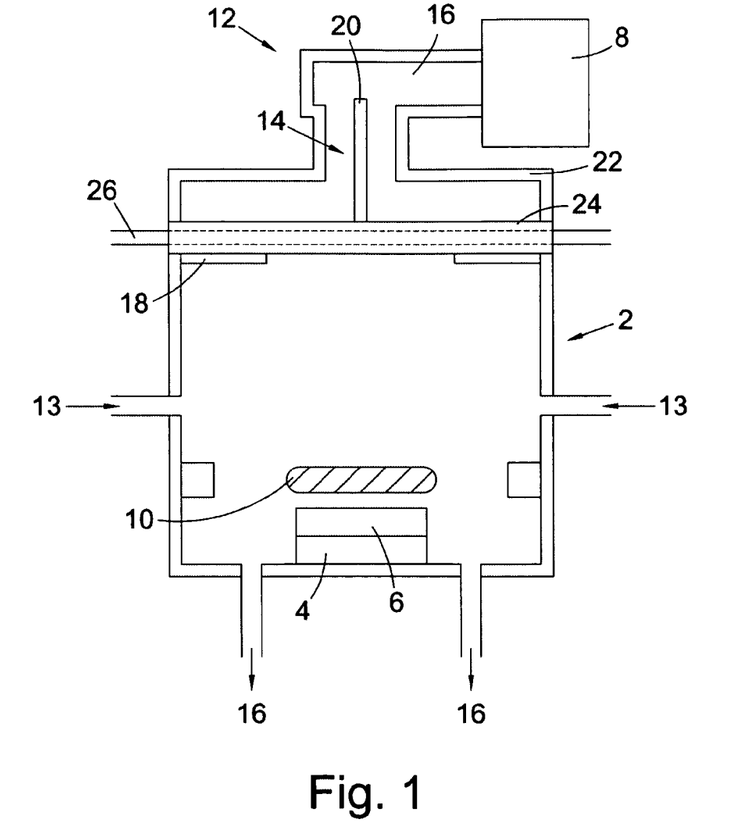
FIG. 1 shows a cross-sectional view of a microwave plasma reactor configured to deposit synthetic diamond material using a chemical vapour deposition technique.

FIG. 1 shows one embodiment of a microwave plasma reactor according to an embodiment of the present invention. The microwave plasma reactor comprises the following basic components: a plasma chamber 2; a substrate holder 4 disposed in the plasma chamber for holding a substrate 6; a microwave generator 8, for forming a plasma 10 within the plasma chamber 2; a microwave coupling configuration 12 for feeding microwaves from the microwave generator 8 into the plasma chamber 2; and a gas flow system comprising a gas inlet 13 and a gas outlet 16 for feeding process gases into the plasma chamber 2 and removing them therefrom.

It should also be noted that while the microwave plasma reactor illustrated in FIG. 1 has a separate substrate holder disposed in the plasma chamber, the substrate holder may be formed by the base of the plasma chamber. The use of the term "substrate holder" is intended to cover such variations. Furthermore, the substrate holder may comprise a flat supporting surface which is the same diameter (as illustrated) or larger than the substrate. For example, the substrate holder may form a large flat surface, formed by the chamber base or a separate component disposed over the chamber base, and the substrate may be carefully positioned on a central region of the flat supporting surface. In one arrangement, the flat supporting surface may have further elements, for example projections or grooves, to align, and optionally hold, the substrate. Alternatively, no such additional elements may be provided such that the substrate holder merely provides a flat supporting surface over which the substrate is disposed.

The microwave coupling configuration 12 comprises a coaxial waveguide 14 configured to feed microwaves from a rectangular waveguide 16 to an annular dielectric window 18. The coaxial waveguide 14 comprises an inner conductor 20 and an outer conductor 22. The inner conductor 20 is a floating post in the illustrated embodiment which is not attached to an upper wall of the rectangular waveguide 16 but rather terminates within the waveguide at a transition region between the rectangular waveguide 16 and the coaxial waveguide 14.

The annular dielectric window 18 is made of a microwave permeable material such as quartz. It forms a vacuum-tight annular window in a top portion of the plasma chamber 2. The microwave generator 8 and the microwave coupling configuration 12 are configured to generate a suitable wavelength of microwaves and inductively couple the microwaves into the plasma chamber 2 to form a standing wave within the plasma chamber 2 having a high energy anti-node located just above the substrate 6 in use.

The microwave coupling configuration 12 further comprises a waveguide plate 24 and supply channels 26 for supplying coolant and/or process gas. The waveguide plate is illustrated in more detail in FIGS. 2 and 3. It comprising a plurality of apertures 28 disposed in an annular configuration, each aperture 28 forming a waveguide for coupling microwaves from the coaxial waveguide into the plasma chamber. The waveguide plate also comprises a plurality of channels 26 extending between the apertures suitable for supplying coolant and/or process gas from an outer circumferential region to an inner axial region. The waveguide plate may be formed by machining a single piece of metallic material. Alternatively, the waveguide plate may be formed from multiple components which can be connected together. For example, the central portion of the waveguide plate could be formed of a separate component which is connected to an outer portion in which the plurality of apertures are disposed.

Figure 2:
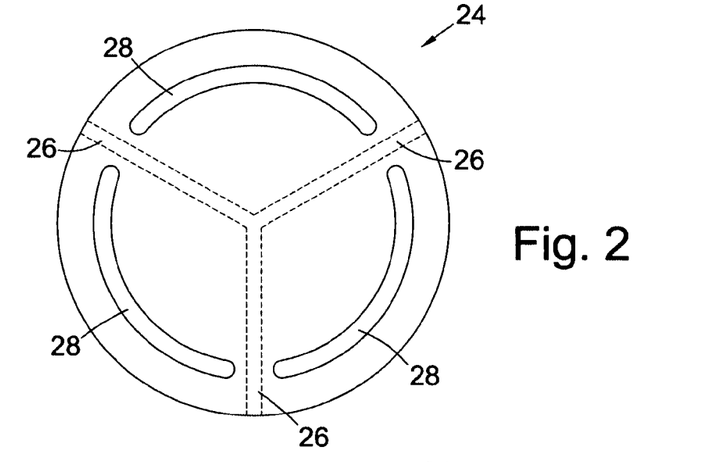
FIG. 2 shows a plan view of a waveguide plate for use in the microwave plasma reactor of FIG. 1.
Figure 3:
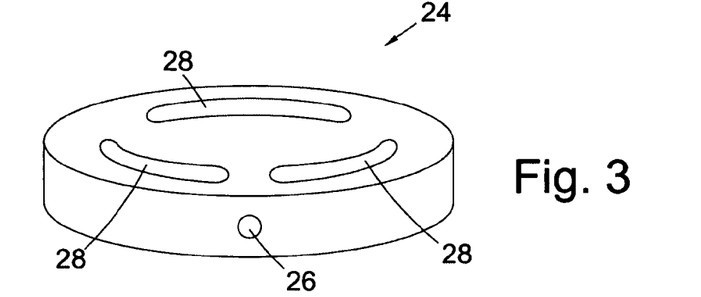
FIG. 3 shows a perspective view of the waveguide plate.

It may be noted that the waveguide plate does not comprise any apertures in a central region thereof. It has been found to be advantageous to inductively couple microwaves into the plasma chamber in a peripheral region of the plasma chamber near upper corners of the chamber. Furthermore, if a central portion of the waveguide plate is left free of microwave waveguide apertures then more space is available for providing one or more gas inlet nozzles in a central portion opposite to the substrate for injecting process gases towards the substrate in use. A preferred inner diameter for the annular configuration of apertures will be dependent on the operational frequency of reactor. For a microwave frequency f in the range 400 MHz to 500 MHz, the annular configuration of apertures may have an inner diameter no less than 500 mm, 600 mm, or 700 mm. For a microwave frequency f in the range 800 MHz to 1000 MHz, the annular configuration of apertures may have an inner diameter no less than 250 mm, 300 mm, or 400 mm. For a microwave frequency f in the range 2300 MHz to 2600 MHz, the annular configuration of apertures may have an inner diameter no less than 90 mm, 110 mm, or 130 mm.

It is also advantageous for most of the circumference of the annular configuration to be formed by the apertures rather than the arms disposed between the apertures. The arms are advantageously only sufficiently large to provide support for the central portion of the waveguide plate and for allowing process gas and/or coolant channels to pass between the apertures. For example, the apertures may account for over 250°, 290°, 310°, or 330° of the 360° circumference of the annular aperture configuration. An upper limit of 350° may be applied or otherwise the arms become too narrow to provide mechanical support and for allowing process gas and/or coolant channels to pass between the apertures.

Figure 4:
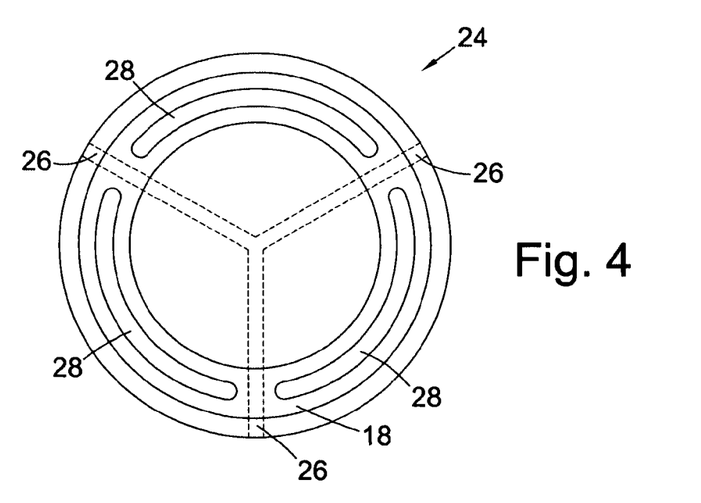
FIG. 4 shows an example of how the waveguide plate and an annular dielectric window can be arranged for insertion into a microwave plasma reactor.

FIG. 4 shows an example of how the waveguide plate and the annular dielectric window can be arranged for insertion into a microwave plasma reactor. The annular dielectric window 18 is disposed adjacent the waveguide plate 24 such that the apertures 28 in the waveguide plate are aligned with the annular dielectric window 18.

Figure 5:
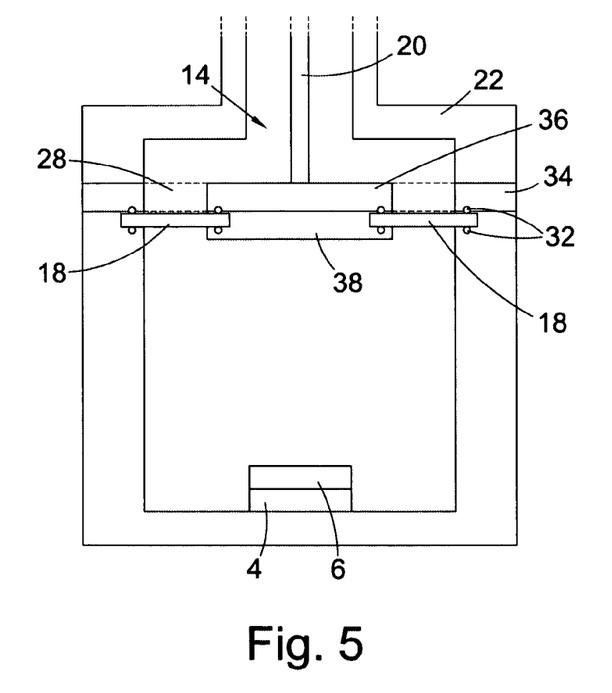
FIG. 5 shows a cross-sectional view of a microwave plasma reactor illustrating an example of how the waveguide plate and annular dielectric window can be mounted in the reactor.

FIG. 5 shows a cross-sectional view of a microwave plasma reactor illustrating an example of how the waveguide plate and annular dielectric window can be mounted in the reactor. The same reference numerals as used in FIG. 1 have been used for corresponding parts in FIG. 5. Some of the components of the reactor are not shown in FIG. 5 for reasons of clarity as FIG. 5 is intended to focus on a suitable mounting arrangement for the waveguide plate and the annular dielectric window.

In the illustrated arrangement, an outer peripheral portion 34 of the waveguide plate is disposed between the outer conductor 22 of the coaxial waveguide 14 and a side wall of the plasma chamber. An outer peripheral portion of the annular dielectric window 18 is disposed between the waveguide plate and the side wall of the plasma chamber. An inner portion of the annular dielectric window 18 is held between an inner portion 36 of the waveguide plate and a further plate 38. The apertures 28 in the waveguide plate are aligned with the annular dielectric window 18 and channels for supplying coolant and/or process gas pass between the apertures into the inner portion 36 of the waveguide plate. The annular dielectric window 18 may be mounted to the waveguide plate using elastomer o-rings 32. In this arrangement the further plate 38 can be attached to the waveguide plate 24 with a portion of the dielectric window 18 disposed and held therebetween via elastomeric o-rings 32.

The waveguide plate as illustrated in FIGS. 1 to 5 fulfils several advantageous functions:
  (i) it allows injection of coolant and/or process gases;
  (ii) it supports a floating central coaxial conductor;
  (iii) it forms a coupling between the upper and lower parts of the plasma chamber;
  (iv) it feeds microwaves from the coaxial waveguide into the plasma chamber; and
  (v) it supports an annular dielectric window.

Other alternative arrangements may be envisaged which will fulfil one or more of these advantageous features. For example, in the previously described arrangement the waveguide plate is positioned adjacent the annular dielectric window. Furthermore, the waveguide plate is positioned between the coaxial waveguide and the annular dielectric window. However, in an alternative arrangement the annular dielectric window may be mounted between the coaxial waveguide and the waveguide plate. Yet another possibility is for the dielectric window to be segmented with each segment being mounted in a corresponding aperture within the waveguide plate. Alternatively still, two waveguide plates may be provided with an annular dielectric window sandwiched therebetween. Yet another possibility is to locate the waveguide plate further up the coaxial waveguide so that it is spaced apart from the annular window. In such an arrangement, the waveguide plate may form a ring comprising a plurality of apertures disposed within the coaxial line.

In the illustrated embodiment, the plurality of apertures in the waveguide plate are configured to couple microwaves into the plasma chamber in a direction parallel to a central axis of the plasma chamber. In this arrangement, the waveguide plate is disposed in a plane perpendicular to a central axis of the plasma chamber and forms a portion of an upper wall in the plasma chamber. However, the waveguide plate could be located within a coaxial waveguide which couples microwaves into a side wall of the plasma chamber in a modified version of the arrangement disclosed in U.S. Pat. No. 6,645,343. That said, such an alternative is considered to be an inferior solution as it has been found that coupling microwaves into the plasma chamber in a direction parallel to the axis of the chamber is more efficient and avoids the need for a more complex coaxial feed configuration. As such, even if channels for coolant and/or process gas are not provided in the waveguide plate, and/or no floating post is provided, the waveguide plate according to the present invention is still advantageous for coupling microwaves into the plasma chamber in an efficient and simple manner.

The plurality of apertures are preferably configured to have a periodic rotational symmetry. For example, if n apertures are provided, the apertures are configured symmetrically around a circle to have n fold rotational symmetry. A symmetric arrangement is preferred to avoid asymmetries in the electric field within the plasma chamber formed as a result of asymmetries in the apertures. That said, it is also envisaged that it may be possible to introduce small asymmetries in the aperture configuration without unduly affecting the uniformity of the electric field in the plasma forming region above the growth surface of the substrate or otherwise compensate for non-uniformities in the apertures using, for example, mode cancelling blocks which are discussed later in this specification.

The annular dielectric window as previously described is formed of a single complete ring of dielectric material. However, in an alterative arrangement the annular dielectric window may be formed of a plurality of separate arcuate segments, each segment sealed across a corresponding aperture of the waveguide plate.

In the previously described arrangement, the waveguide plate comprises an outer peripheral portion which is disposed between the outer conductor of the coaxial waveguide and an outer wall of the plasma chamber. Furthermore, the waveguide plate comprises a central portion which extends across the plasma chamber. The central portion of the waveguide plate extends across the plasma chamber at an end opposite to an end at which the substrate holder is disposed and the inner conductor forms a floating conductor supported by the central portion of the waveguide plate. However, it is envisaged that the waveguide plate may also be used with a grounded inner conductor while still avoiding the requirement to supply coolant and/or process gases down the central coaxial conductor.

In one configuration the one or more channels extending between the apertures in the waveguide plate comprise at least one channel configured to supply process gas to one or more injection ports arranged opposite the substrate holder for injecting process gas towards the substrate holder. This configuration allows an axial gas flow arrangement to be disposed at the same end of the chamber as the microwave coupling configuration. Alternatively the microwave coupling configuration may be disposed at the same end of the plasma chamber as the substrate holder.

A central portion of the waveguide plate can support a conductive surface disposed opposite the substrate holder. The conductive surface may be formed by the waveguide plate or may be formed by a separate metallic body which is connected to a central portion of the waveguide plate. One or more gas inlet nozzles may be disposed in the conductive surface for injecting process gas towards the substrate holder. In one configuration, the conductive surface is curved and extends towards a central region of the plasma chamber. For example, the conductive surface may form a cone-shaped body. Such a conductive surface is useful as it can aid in preventing plasma formation in an upper region of the plasma chamber. Effectively, the conductive surface can mask off a high electric field region in use. That is, the conductive surface can be located to enclose a high electric field anti-node region which would exist in a corresponding chamber which did not comprise the conductive surface extending towards a central region of the plasma chamber.

The conductive surface may form a bowl of uniform curvature, a pointed cone, or any intermediate conical structure. In one preferred arrangement, the conductive surface is a conical surface. The conical surface most preferably has a rounded tip. The conical surface may be configured to be approximately orthogonal to the electric field vector of the resonance mode of the cavity thereby minimizing perturbations in the electric field as a result of the introduction of the conical body into the resonance cavity. It is possible to eliminate a high electric field anti-node without unduly affecting the basic electric field profile in a lower part of the chamber by placing a conductive metal surface orthogonal to the electric field in the region of an upper high electric field anti-node to effectively eliminate the upper high electric field region. While the resonant frequency of the chamber should not be unduly altered, the Q factor of the chamber will reduce due to a reduction in the stored energy in the cavity while the energy dissipated per cycle remains the same or increases slightly with the increased surface area.

The cone-shaped conductive surface can extend up to one quarter wavelength of the plasma chamber. Placing the cone-shaped conductive surface at the driven end of the chamber where the microwaves are coupled into the chamber ensures that the phase of the reflected wave is correct with respect to the conductive surface. The waveguide plate according to embodiments of the present invention allows a cone-shaped conductive member to be conveniently supported in a central region at the driven end of the chamber with microwaves being coupled into the chamber around a peripheral region of the cone shaped conductive member via the apertures in the waveguide plate. An alternative possibility is to place the cone-shaped conductive surface at the non-driven end (i.e. at an end of the chamber where microwaves are not coupled into the chamber) resulting in an arrangement where the annular dielectric window is positioned around the substrate although this arrangement could lead to damage of the dielectric window. One advantage of locating the cone-shaped conductive surface and the annular dielectric window at the same end of the plasma chamber is that the cone-shaped conductive surface can form an annular recess in the plasma chamber and the annular dielectric window can be disposed in said recess. This arrangement aids in protecting the annular dielectric window in use.

The waveguide plate may include 2, 3, 4, 5, 6, 7 or more apertures. It has been found that varying the number of apertures can affect the efficiency at which microwaves are coupled into the plasma chamber. According to certain arrangements, the waveguide plate comprises an odd number of apertures, most preferably a prime number of apertures. For example, the waveguide plate may comprise 3, 5, or 7 apertures.

Each aperture is in effect equivalent to a rectangular waveguide. A three way aperture can help to maximize the length of the aperture. Four and six way alternatives have both been found to be deficient from the point of view of mode stability. Despite the presence of several apertures, the power can be predominantly coupled into the cavity in a $TM_{0\ mn}$ mode. There are effects from the symmetry of the apertures visible in the form of the generation of high order modes i.e. $TM_{1\ mn}$ (where 1 does not equal zero). Thus a three way aperture in which all three apertures are excited in phase will couple to the $TM_{3\ mn}$ series of modes while the four and six way apertures might be expected to couple with the much higher order $TM_{8\ mn}$ and $TM_{12\ mn}$ modes. In practice however, the four and six way apertures are prone to parasitic modes. Thus a four or six way aperture can couple into the $TM_{2\ mn}$ modes. Overall the effect is that the four and six way apertures can produce asymmetries in the plasma that result in either the plasma moving off centre or splitting two ways. The three way aperture gives a stable three way pulling effect that is less undesirable than the more serious one way and two way break-up modes that occur with other configurations. Instabilities can be dealt with using mode cancelling blocks which are basically metal bodies that produce a perturbation to the local electric field that is intended to cancel that of the three way mode produced by the apertures. The position of these metal blocks can be established empirically. By placing them in regions of high wall current (i.e. where the H field is high) the blocks can be used to disrupt the unwanted mode. As such in one arrangement a plurality of mode cancelling blocks are disposed on an inner wall of the plasma chamber, for example on a side wall or on a base of the chamber, the mode cancelling blocks being configured to compensate for electromagnetic perturbations caused by the plurality of apertures. The mode cancelling blocks are spaced apart so as to be symmetrically related to the aperture configuration. For example, the number of mode cancelling blocks may be equal to the number of apertures provided in the waveguide plate, the mode cancelling blocks being positioned to have a symmetry which corresponds to the aperture arrangement. For example, if three apertures are provided in the waveguide plate then three mode cancelling blocks may be mounted around the plasma chamber wall in a lower portion of the plasma chamber and arranged symmetrically so as to cancel perturbations in the electric field caused by the apertures. Alternatively, the number of mode cancelling blocks may be an integer multiple of the number of apertures while still being arranged to be symmetrically related to the aperture configuration. The mode cancelling blocks can be adhered to an inner wall of the plasma chamber or may be integrally formed by a wall of the plasma chamber. Another possible alternative to the three way aperture is to use a five or seven way aperture. Because these are prime numbers they are resistant to over-moding with lower order two way modes etc. In this case the mode cancelling blocks may not be required.

It is further advantageous to supply microwave energy to a plasma chamber via apertures having a specific radial width. A ratio of the annular gap (in a radial direction) provided by the apertures in the waveguide plate to that of a diameter of the plasma chamber may be in the range 1/10 to 1/50, 1/20 to 1/40, 1/25 to 1/35, or optionally approximately 1/30. This annular gap may be provided by locating the apertures adjacent the side wall of the plasma chamber with the outer conductor of the coaxial waveguide being comparable in diameter to the diameter of the resonance cavity of the plasma chamber and the inner conductor being only slightly smaller than the outer conductor to achieve a ratio as previously specified for the annular gap. By varying the ratio of the diameters of these two conductors it is possible to find an optimum point at which a match to the chamber is achieved. In an alternative arrangement, the apertures may be placed away from the side walls of the plasma chamber, e.g. at an intermediate position between the centre and an edge of the top plate.

It should be noted that while terms such as "top", "base", "upper" and lower" are used in this specification when describing the plasma reactor, it is possible to invert the reactor. As such, these terms refer to the location of the reactor components relative to each other and not necessarily their location relative to the earth. For example, in standard usage, the substrate will be supported by the base of the chamber which will form the lower wall of the chamber relative to the earth. However, it is possible to invert the reactor such that the base of the chamber supporting the substrate will form the upper wall of the chamber relative to the earth. In the inverted orientation gas flow towards the substrate may be parallel to principle thermally driven convection currents (which are in an upwards direction due to the large amount of heat generated in the plasma which is below the substrate in an inverted arrangement). This inverted arrangement may have some benefits for certain applications.

Embodiments of the present invention improve uniformity in a CVD diamond growth process. Improvement in uniformity can be measured by one or more of the following parameters: thickness uniformity of a CVD diamond film (across the deposition area); uniformity of one or more quality parameters of the diamond material (e.g. colour, optical properties, electronic properties, nitrogen uptake, boron uptake, and/or boron activation level); in polycrystalline diamond material, uniformity of texture, surface morphology, grain size, etc. . . . ; or in single crystal diamond material where growth takes place on an array of single crystal diamond substrates on a substrate carrier, uniformity of thickness, morphology, edge twinning, lateral growth, etc. . . . , between each single crystal. The key parameters chosen for assessing uniformity depend on the synthesis process, the economics of fabricating the final product from the synthesis product, and the requirements of the final product itself.

While this invention has been particularly shown and described with reference to preferred embodiments, it will be understood to those skilled in the art that various changes in form and detail may be made without departing from the scope of the invention as defined by the appendant claims.

The invention claimed is:

1. A microwave plasma reactor for manufacturing a synthetic diamond material via chemical vapour deposition, the microwave plasma reactor comprising:
   a plasma chamber;
   a substrate holder disposed in the plasma chamber for supporting a substrate on which the synthetic diamond material is to be deposited in use;
   a microwave coupling configuration for feeding microwaves from a microwave generator into the plasma chamber; and
   a gas flow system for feeding process gases into the plasma chamber and removing them therefrom,
   wherein the microwave coupling configuration for feeding microwaves from the microwave generator into the plasma chamber comprises:
   an annular dielectric window formed in one or several sections;
   a coaxial waveguide having a central inner conductor and an outer conductor for feeding microwaves to the annular dielectric window; and
   a waveguide plate comprising a plurality of apertures disposed in an annular configuration with a plurality of arms extending between the apertures, each aperture forming a waveguide for coupling microwaves towards the plasma chamber;
   wherein the plurality of arms define one or more channels for supplying coolant and/or process gas,
   wherein the one or more channels comprise at least one channel configured to supply process gas to one or more injection ports arranged opposite the substrate holder for injecting process gas towards the substrate holder,
   wherein the waveguide plate comprises a central portion which extends across the plasma chamber and is supported by the plurality of arms extending between the apertures, and
   wherein the central inner conductor of the coaxial waveguide forms a floating conductor supported by the central portion of the waveguide plate.

2. A microwave plasma reactor according to claim 1, wherein the waveguide plate comprises an odd number of apertures.

3. A microwave plasma reactor according to claim 2, wherein the waveguide plate comprises a prime number of apertures.

4. A microwave plasma reactor according to claim 3, wherein the waveguide plate comprises 3, 5, or 7 apertures.

5. A microwave plasma reactor according to claim 1, wherein the waveguide plate is positioned adjacent the annular dielectric window.

6. A microwave plasma reactor according to claim 1, wherein the waveguide plate is positioned between the coaxial waveguide and the annular dielectric window.

7. A microwave plasma reactor according to claim 1, wherein the annular dielectric window is positioned between the coaxial waveguide and the waveguide plate.

8. A microwave plasma reactor according to claim 1, wherein the annular dielectric window comprises two opposing surfaces through which microwaves are coupled into the plasma chamber and seals are provided on said two opposing surfaces.

9. A microwave plasma reactor according to claim 1, wherein the one or more channels comprise at least one channel configured to supply coolant.

10. A microwave plasma reactor according to claim 1, wherein the plurality of apertures are configured to couple microwaves towards the plasma chamber in a direction parallel to a central axis of the plasma chamber.

11. A microwave plasma reactor according to claim 1, wherein the central portion of the waveguide plate supports a conductive surface disposed opposite the substrate holder, wherein the conductive surface is cone-shaped.

12. A microwave plasma reactor according to claim 1, wherein a plurality of mode cancelling blocks are disposed on an inner wall of the plasma chamber, the mode cancelling blocks being spaced apart so as to be symmetrically related to the aperture configuration.

13. A microwave plasma reactor according to claim 1, wherein a ratio of an annular gap provided by the apertures in the waveguide plate to that of a diameter of the plasma chamber is in the range 1/10 to 1/50, 1/20 to 1/40, 1/25 to 1/35, or is 1/30.

* * * * *